United States Patent
Matsufusa et al.

(10) Patent No.: US 6,184,872 B1
(45) Date of Patent: Feb. 6, 2001

(54) COORDINATE DATA INPUT DEVICE AND METHOD OF FABRICATING THE SAME

(75) Inventors: Hideto Matsufusa; Ryuichi Hagiya; Naoki Yamada, all of Fukushima-ken (JP)

(73) Assignee: Alps Electric Co., Ltd., Tokyo (JP)

( * ) Notice: Under 35 U.S.C. 154(b), the term of this patent shall be extended for 0 days.

(21) Appl. No.: 09/163,999

(22) Filed: Sep. 30, 1998

Related U.S. Application Data

(62) Division of application No. 08/847,240, filed on May 1, 1997, now Pat. No. 5,896,127.

(30) Foreign Application Priority Data

May 14, 1996 (JP) .................................................. 8-118959

(51) Int. Cl.⁷ ............................................ G09G 5/00
(52) U.S. Cl. ..................... 345/173; 345/174; 178/18.01; 178/18.03
(58) Field of Search ....................... 345/173, 174, 345/168; 178/18, 18.01, 18.03, 19.03

(56) References Cited

U.S. PATENT DOCUMENTS

| | | |
|---|---|---|
| 4,794,634 | 12/1988 | Torihata et al. . |
| 4,797,514 | 1/1989 | Talmage, Jr. et al. . |
| 4,801,767 | 1/1989 | Sato et al. . |
| 4,801,771 | 1/1989 | Mizuguchi et al. . |
| 5,565,657 * | 10/1996 | Merz ........................................ 178/18 |
| 5,869,790 * | 2/1999 | Shigetaka et al. ................. 178/18.03 |
| 5,896,127 * | 4/1999 | Matsufusa et al. .................... 345/173 |

FOREIGN PATENT DOCUMENTS 5-7062   1/1993   (JP) .

* cited by examiner

Primary Examiner—Richard A. Hjerpe
Assistant Examiner—Kimnhung Nguyen
(74) Attorney, Agent, or Firm—Brinks Hofer Gilson & Lione

(57) ABSTRACT

A coordinate data input device is fabricated by stacking a sensing board having a film provided with a plurality of parallel x-electrodes on its front surface, a plurality of parallel y-electrodes extending perpendicularly to the first electrodes on its back surface, and through holes formed at one end of each electrodes, and a printed wiring board provided with a plurality of through holes at positions corresponding to the through holes formed in the film of the sensing board at the ends of the first and the second electrodes, and a circuitry formed on its back surface, for driving and controlling the first and the second electrodes of the sensing board. Conductive films are formed on the side surfaces of the through holes of the sensing board and those of the printed wiring board so as to electrically connect the first and the second electrodes of the sensing board to the circuitry of the printed wiring board.

1 Claim, 3 Drawing Sheets

SUCTION

COORDINATE DATA INPUT DEVICE AND METHOD OF FABRICATING THE SAME

CROSS-REFERENCE TO RELATED APPLICATION

This is a divisional of application Ser. No. 08/847,240 filed May 1, 1997, that issued as U.S. Pat. No. 5,896,127.

BACKGROUND OF THE INVENTION

The present invention relates to a coordinate data input device of an electrostatic capacity type capable of detecting the position of a point on a screen touched mainly with a finger through the detection of a change in electrostatic capacity, and a method of fabricating such a coordinate data input device.

Recently, a coordinate data input device of an electrostatic capacity type generally referred to as tablet has been put to practical use. An operator is able to enter the x- and the y-coordinate of a point on the screen of the coordinate data input device by touching the point with a finger.

A conventional coordinate data input device has a printed circuit board, a sensing sheet using a rectangular dielectric film as a base film and placed on the printed wiring board, and a flexible wiring board electrically connecting the printed wiring board and the sensing sheet. The dielectric film of the sensing sheet is provided on its front surface with a plurality of parallel x-electrodes extended in parallel to the x-axis. Ends of the x-electrodes on the same side of the dielectric film serve as connecting ends, and a first connector is connected to the connecting ends of the x-electrodes. The dielectric film is provided on its back surface with a plurality of parallel y-electrodes extended in parallel to the y-axis. Ends of the y-electrodes on the same side of the dielectric film serve as connecting ends, and a second connector is connected to the connecting ends of the y-electrodes. The opposite ends of the flexible wiring board are connected to the connectors and the printed wiring boards to electrically connect the electrodes of the sensing sheet to drive circuits and control circuits formed on the printed wiring board.

When an operator's finger is put to an optional position on the sensing sheet, part of lines of electric force extending from the x-electrodes toward the y-electrodes is intercepted by the operator's finger to reduce lines of electric force reaching the y-electrodes, so that the electrostatic capacity changes, and the coordinates of the position touched with the operator's finger can be determined on the basis of an output current produced by the sensing sheet varying according to the variation of the electrostatic capacity.

As mentioned above, in the conventional coordinate data input device of an electrostatic capacity type, the x-electrodes and the y-electrodes formed on the sensing sheet are electrically connected through the connectors and the flexible wiring board to the printed wiring board. Therefore, the thickness of the coordinate data input device is dependent on the relatively great thickness of the connectors attached to the front and the back surface of the sensing sheet. Since the flexible wiring board is expanded toward one side of the sensing sheet and is extended to the printed wiring board, a relatively large space is required to layout the flexible wiring board, which increases the overall external dimensions of the coordinate data input device.

SUMMARY OF THE INVENTION

Accordingly, it is an object of the present invention to provide a miniaturized coordinate data input device having a relatively small thickness, and to provide a method of fabricating the coordinate data input device.

According to one aspect of the present invention, a coordinate data input device comprises: a sensing board having a film provided with a plurality of parallel first electrodes on its front surface, a plurality of parallel second electrodes extending perpendicularly to the first electrodes on its back surface, and through holes formed at one end of each of the first electrodes and at one end of each of the second electrodes; a printed wiring board mounted with the sensing board, and provided with a plurality of through holes at positions corresponding to the through holes formed at the ends of the first and the second electrodes, and a circuitry for controlling and driving the first and the second electrodes of the sensing board formed on its back surface; and conductive films formed on the side surfaces of the through holes of the sensing board and those of the printed wiring board so as to electrically connect the first and the second electrodes of the sensing board to the circuitry of the printed wiring board.

The coordinate data input device of the present invention does not need any connectors and any flexible wiring board, which are necessary in the conventional coordinate data input device to electrically connect the sensing board to the printed wiring board. The thickness of the coordinate data input device of the present invention is smaller by the thickness of the connectors than that of the conventional coordinate data input device, and does not need any space for laying the flexible wiring board.

According to another aspect of the present invention, a method of fabricating a coordinate data input device according to the present invention comprises steps of: mounting a sensing board having a film provided with a plurality of parallel first electrodes on its front surface, a plurality of parallel second electrodes extending perpendicularly to the first electrodes on its back surface, and through holes formed at one end of each of the first electrodes and at one end of each of the second electrodes on a printed wiring board provided with a plurality of through holes at positions corresponding to the through holes formed at the ends of the first and the second electrodes, and a circuitry formed on its back surface, for driving and controlling the first and the second electrodes of the sensing board; and forming conductive films of a conductive material by printing on the side surfaces of the through holes of the sensing board and those of the printed wiring board so as to electrically connect the first and the second electrodes of the sensing board to the circuitry of the printed wiring board while air is sucked through the through holes.

The conductive films can simply be formed by printing on the side surfaces of the through holes so as to be electrically connected to the electrodes of the sensing board and, therefore, the electrodes of the sensing board can easily connected electrically to the circuitry of the printed wiring board with satisfactory reliability.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
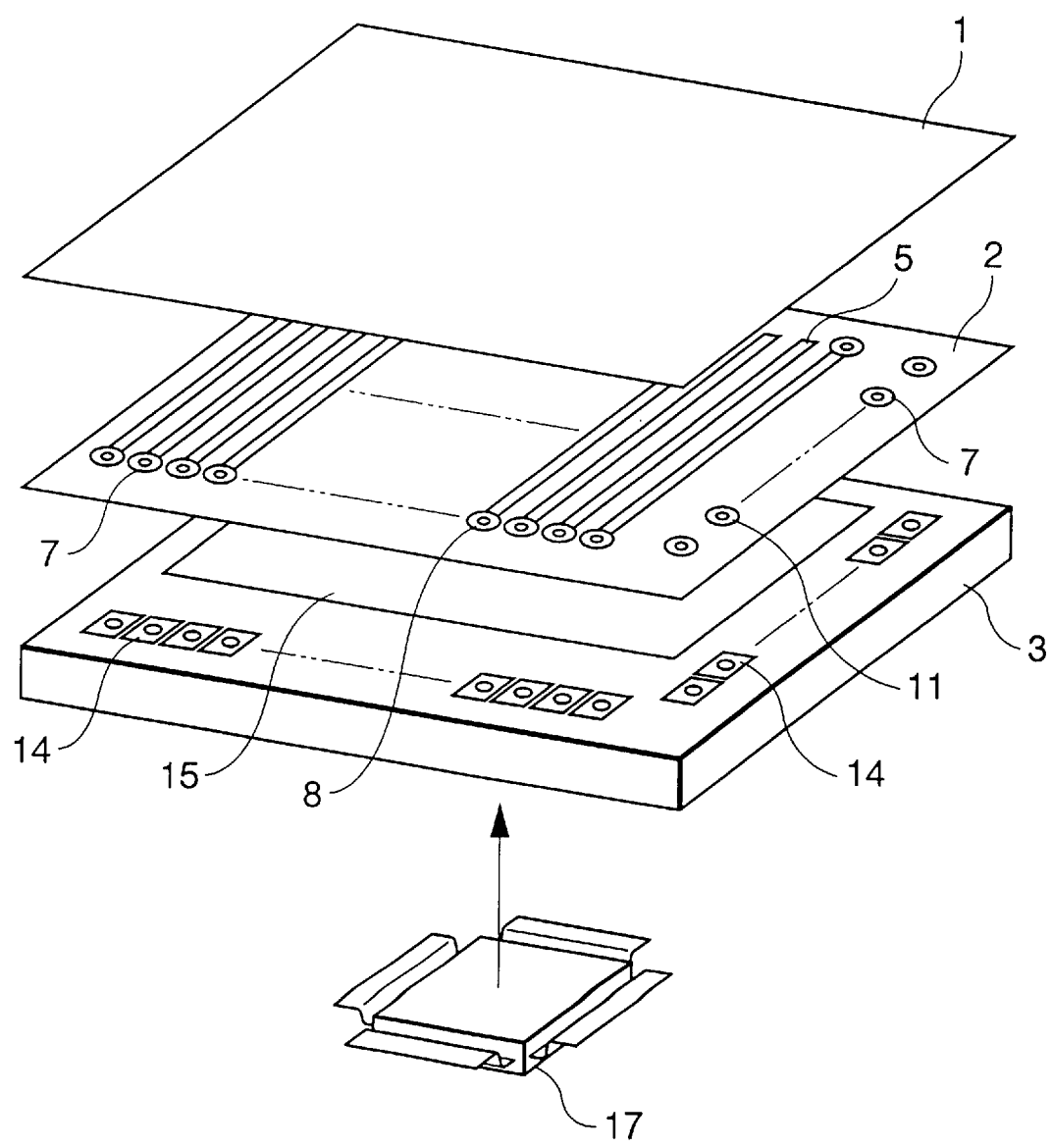
FIG. 1 is an exploded perspective view of a coordinate data input device in a preferred embodiment according to the present invention.

Referring to FIG. 1, a coordinate data input device in a preferred embodiment according to the present invention comprises, as principal components, a protective sheet 1, such as a PET film, a sensing board 2 underlying the protective sheet 1, and a printed wiring board 3 underlying the sensing board 2. The surface of the protective sheet 1 serves as a touch surface to which touches a given with a position indicating means, such as a finger.

Figure 2:
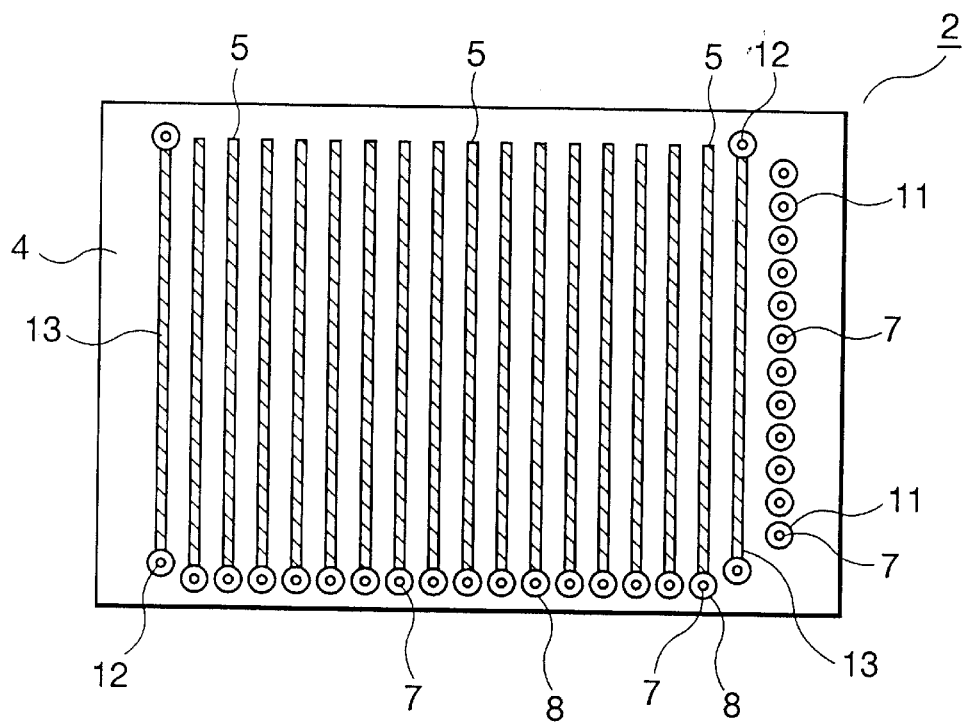
FIG. 2 is a plan view of a sensing board included in the coordinate data input device of FIG. 1.
Figure 3:
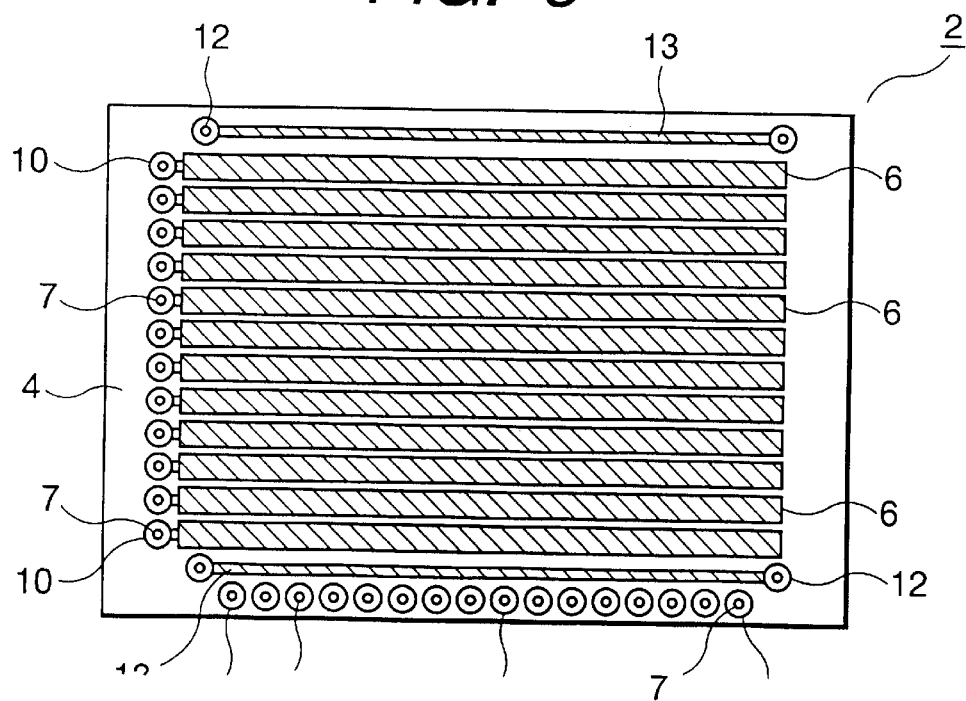
FIG. 3 is a bottom view of the sensing board of FIG. 2.

The sensing board 2 is formed by forming a plurality of parallel x-electrodes 5 on the front surface of a rectangular base film 4, such as a PET film, so as to extend in parallel to the x-axis as shown in FIG. 2, and forming a plurality of parallel y-electrodes 6 on the back surface of the base film 4 so as to extend in parallel to the y-axis as shown in FIG. 3. The groups of the x-electrodes 5 and the y-electrodes 6 forms a matrix in a plane. The x-electrodes 5 are formed in a small width to secure a satisfactory resolution, while the y-electrodes 6 are formed in a relatively great width ensure the detection of a touch given to the protective sheet with the position indicating means, such as a finger. The film 4 is provided with through holes 7 at ends of the x-electrodes 5 on one side of the film 4 and at ends of the y-electrodes on one side of the film 4, first lands 8 and second lands 9 formed around the opposite ends, respectively, of the through holes 7 formed at the ends of the x-electrodes 5, and third lands 10 and fourth lands 11 formed around the opposite ends, respectively, of the through holes 7 formed at the ends of the y-electrodes 6. Grounding lines 13 for reducing the effect of noise are formed at the opposite ends, respectively, of the arrangement of the x-electrodes 5 on the front surface of the film 4, and at the opposite ends, respectively, of the arrangement of the y-electrodes 6 on the back surface of the film 4. The x-electrodes 5, the y-electrodes 6, the lands 8 to 11 and the grounding lines 13 are formed by printing a conductive material, such as a silver paste, on the film 4.

Figure 4:
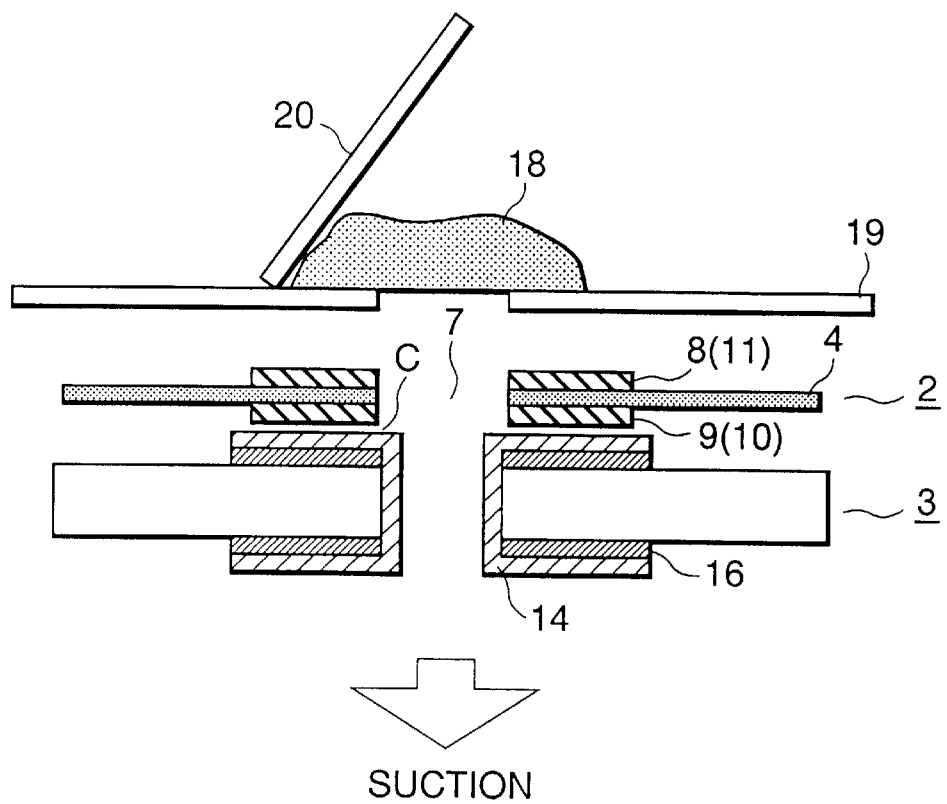
FIG. 4 is a typical view of assistance in explaining a method of forming conductive films of a conductive material for electrically connecting electrodes formed on the sensing board to a circuitry formed on a printed wiring board.
Figure 5:
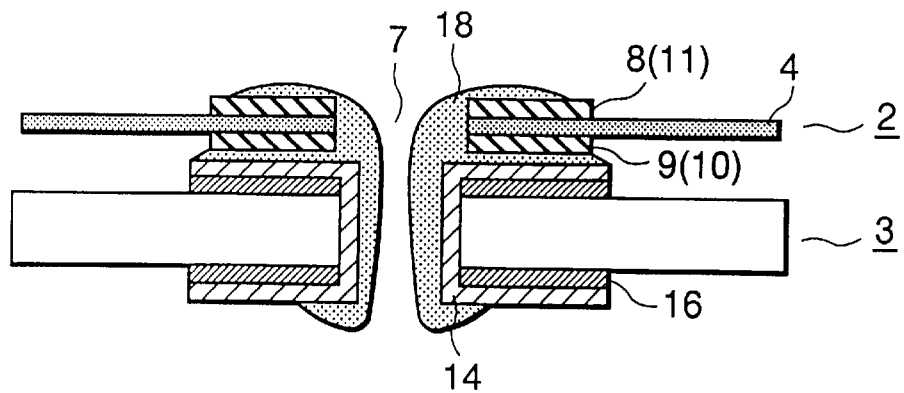
FIG. 5 is a typical view of the electrodes formed on the sensing board electrically connected to the circuitry formed on the printed wiring board by the method explained with reference to FIG. 4.

The printed wiring board 3 is provided with through holes 14 at positions respectively corresponding to the through holes 7 of the film 4. A grounding layer 15 of, for example, a copper foil, is formed in a central region of the upper surface of the printed wiring board 3 to intercept the penetration of noise from below the printed wiring board 3 into the x-electrodes 5 and the y-electrodes 6. A wiring pattern 16, only portions of which are shown, is formed by patterning a copper foil or the like on the back surface of the printed wiring board 3. An IC chip 17 for driving and controlling the x-electrodes 5 and the y-electrodes 6 are connected to the wiring pattern 16 by soldering. Lands included in the wiring pattern 16 are electrically connected to the through holes 14 as shown in FIGS. 4 and 5. In this embodiment, the diameter of the through holes 7 is greater than that of the through holes 14 corresponding to the through holes 7.

The through holes 7 and the through holes 14 corresponding to the through holes 7 form through holes extending through the sensing board 2 and the printed wiring board 3, respectively. The side surfaces of the through holes 7 and 14, and the surfaces of the lands 8 to 11 are coated with conductive films 18 of a conductive material, such as a carbon paste or a silver paste. The x-electrodes 5 and the y-electrodes are connected through the conductive films 18 to the wiring pattern 16.

A method of fabricating the coordinate data input device of this construction forms the conductive films 18 at the predetermined portions by the following processes. First, the sensing board 2 is positioned on and bonded to the printed wiring board 3. Then, the conductive films 18 are formed on the side surfaces of the through holes 7 and around the through holes 7 as shown in FIG. 4 by screen printing using a printing plate 19 and a squeegee 20. The conductive films 18 can simply and surely formed on the surfaces of the through holes 7 and 14 forming the through holes extending through the sensing board 2 and the printed wiring board 3, the first lands 8 formed at the ends of the x-electrodes 5, and the third lands 10 formed at the ends of the y-electrodes 6. Thus, the x-electrodes 5 and the y-electrodes can simply and surely connected to the wiring pattern 16 formed on the back surface of the printed wiring board 3, and the IC chip 17 attached to the printed wiring board 3.

Since the diameter of the through holes 7 is greater than that of the through holes 14, the conductive material for forming the conductive films 18 penetrates into gaps between the back surface of the sensing board 2 and the front surface of the printed wiring board 3, more specifically, gaps C (FIG. 4) between the second lands 9 (the third lands 10) and regions in the upper surface of the printed wiring board 3 around the upper ends of the through holes 14 by capillarity and vacuum created by suction. Thus, the sensing board 2 and the printed wiring board 3 can surely and electrically be connected.

In the coordinate data input device of the present invention, the x-electrodes and the y-electrodes are electrically connected to the wiring pattern 16 of the printed wiring board 3 and the IC chip 17 mounted on the printed wiring board 3 through the conductive films 18 formed on the side surfaces of the through holes each consisting of the through hole 7 of the sensing board 2 and the through hole 14 of the printed wiring board 3. Therefore, the connectors and the flexible wiring board employed in electrically connecting the sensing board and the printed wiring board in the conventional coordinate data input device are unnecessary, and hence the thickness of the coordinate data input device of the present invention is smaller than that of the conventional coordinate data input device by the thickness of the connectors, and the planar size of the former is smaller than that of the latter by the space to be secured on one side of the latter coordinate data input device for laying the flexible wiring board. The method of fabricating the coordinate data input device of the present invention creates a suction in the through holes each consisting of the through holes 7 and 14 from the back side of the printed wiring board 3 when forming the conductive films 18 by screen printing. Therefore, the conductive material applied to the front surface of the sensing board 2 by screen printing to form the conductive films 18 can surely and easily spread over the side surfaces of the through holes 7 and 14. Thus, the electrical connection of the sensing board 2 and the printed wiring board can very easily and surely be achieved with reliability.

In a modification of the foregoing coordinate data input device of the present invention, the through holes 7 each formed at one end of each x-electrode and the through holes 7 each formed at one end of each y-electrode 6 may be formed continuously in a slit of a planar shape substantially resembling the letter L. Metal layers formed on the side surfaces of the through holes 14 may be omitted, provided that the conductive material for forming the conductive films 18 introduced into the through holes 7 can surely spread to the back surface of the printed wiring board 3.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method of fabricating a coordinate data input device, comprising steps of:

mounting a sensing board having a film provided with a plurality of parallel first electrodes on its front surface, a plurality of parallel second electrodes extending perpendicularly to the first electrodes on its back surface, and through holes formed at one end of each of the first electrodes and at one end of each of the second electrodes on a printed wiring board provided with a plurality of through holes at positions corresponding to the through holes formed at the ends of the first and the second electrodes, and a circuitry formed on its back surface, for driving and controlling the first and the second electrodes of the sensing board; and forming conductive films of a conductive material by printing on the side surfaces of the through holes of the sensing board and those of the printed wiring board so as to electrically connect the first and the second electrodes of the sensing board to the circuitry of the printed wiring board while air is sucked through the through holes.

* * * * *